(12) United States Patent
Park et al.

(10) Patent No.: US 12,419,108 B2
(45) Date of Patent: Sep. 16, 2025

(54) DISPLAY APPARATUS INCLUDING A TRANSMITTANCE CONTROL FILM

(71) Applicant: LG Display Co., Ltd., Seoul (KR)

(72) Inventors: Suhyun Park, Busan (KR); Jinhyung Jung, Seoul (KR); Taewoon Ko, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 135 days.

(21) Appl. No.: 18/088,434

(22) Filed: Dec. 23, 2022

(65) Prior Publication Data

US 2023/0215875 A1 Jul. 6, 2023

(30) Foreign Application Priority Data

Dec. 30, 2021 (KR) .......................... 10-2021-0193277
Dec. 7, 2022 (KR) .......................... 10-2022-0169521
Dec. 7, 2022 (KR) .......................... 10-2022-0169522

(51) Int. Cl.
*H10D 86/60* (2025.01)
*G02F 1/1335* (2006.01)
*G02F 1/1362* (2006.01)
*G02F 1/1368* (2006.01)
*H10D 86/40* (2025.01)
*H10K 59/131* (2023.01)

(52) U.S. Cl.
CPC ....... *H10D 86/60* (2025.01); *G02F 1/136286* (2013.01); *G02F 1/1368* (2013.01); *H10D 86/441* (2025.01); *G02F 1/133512* (2013.01); *G02F 2202/04* (2013.01); *G02F 2202/08* (2013.01); *G02F 2202/14* (2013.01); *G02F 2202/28* (2013.01); *G02F 2203/48* (2013.01); *H10K 59/131* (2023.02)

(58) Field of Classification Search
CPC ..................... G02F 1/133512; G02F 1/133509
See application file for complete search history.

(56) References Cited

U.S. PATENT DOCUMENTS

2014/0368772 A1 12/2014 Hwang et al.
2020/0363691 A1* 11/2020 Cai ........................ G02F 1/1533

FOREIGN PATENT DOCUMENTS

| CN | 20-7704150 | * 7/2018 | ............... G02C 7/10 |
| KR | 10-1416922 B1 | 7/2014 | |
| KR | 10-2014-0146873 A | 12/2014 | |

* cited by examiner

*Primary Examiner* — Lauren Nguyen
(74) *Attorney, Agent, or Firm* — Fenwick & West LLP

(57) ABSTRACT

Disclosed is a display apparatus including a display panel including a plurality of light-emitting areas and a non-light-emitting area between the plurality of light-emitting areas, and a transmittance control film including a first area having first visible light transmittance, wherein the first area is disposed on the display panel and overlaps at least a portion of the non-light-emitting area, and a plurality of the second areas having second visible light transmittance higher than the first visible light transmittance, wherein the plurality of the second areas overlap the plurality of light-emitting areas.

16 Claims, 14 Drawing Sheets

(a)          (b)

(a)          (b)

(a)                (b)

DISPLAY APPARATUS INCLUDING A TRANSMITTANCE CONTROL FILM

CROSS-REFERENCE TO RELATED APPLICATION

This application claims priority from Korean Patent Applications No. 10-2021-0193277 filed on Dec. 30, 2021, No. 10-2022-0169521 filed on Dec. 7, 2022, and No. 10-2022-0169522 filed on Dec. 7, 2022 in the Korean Intellectual Property Office, and all the benefits accruing therefrom under 35 U.S.C. 119, the contents of which in its entirety are herein incorporated by reference.

BACKGROUND

Technical Field

The present disclosure relates to a display apparatus. Specifically, the present disclosure relates to a display apparatus capable of lowering reflectance and improving reflective color.

Description of Related Art

As society enters the full-fledged information, various display apparatuses that process and display a large amount of information have been developed. There are various types of display apparatuses that display images, such as a liquid crystal display (LCD) apparatus, an organic light-emitting display (OLED) apparatus, and an electrophoretic display (EPD) apparatus.

The organic light-emitting display apparatus, which is a self-luminous display apparatus, has excellent optical performance such as a field of view and color realization, so that application fields thereof are gradually expanding.

When such a display apparatus is used outdoors or in a bright place, there is a problem that visibility of the display panel is lowered and a contrast ratio characteristic is lowered due to light introduced from the outside, so that various attempts are being made to solve such problem.

SUMMARY

When describing a liquid crystal display apparatus as an example, in a case of the flip panel structure, the display panel is flipped, so that a thin-film transistor array substrate is placed on the top and a color filter substrate is placed on the bottom. Unlike a normal panel structure in which the thin-film transistor array substrate is disposed on the bottom, in the flip panel structure, wirings and electrodes of the thin-film transistor in the thin-film transistor array substrate are exposed to external light, so that reflectance of the display panel is increased due to an increase of internal reflection by the wirings and the electrodes of the thin-film transistor. Further, when copper (Cu) is used, for example, in the wirings and the electrodes of the thin-film transistor in the thin-film transistor array substrate, there is a problem in that a reflective color becomes reddish.

As a low-reflective surface treatment is applied to a surface of the thin-film transistor array substrate, the reflectance by the wirings and the electrodes of the thin-film transistor may be lowered, but the reflective color is not able to be improved.

Moreover, as a black matrix (BM) is applied to the surface of the thin-film transistor array substrate, the reflectance by the wirings and the electrodes of the thin-film transistor may be lowered and the reflective color may be improved, but not only a highly heat-resistant black matrix capable of withstanding a manufacturing process temperature of the thin-film transistor is required, but also a manufacturing cost increases as a manufacturing process becomes complicated.

In a case of an organic light-emitting display apparatus whose application fields are gradually widening, there are problems of reflection of the external light and deterioration of the reflective color due to the various wirings and the electrodes of the thin-film transistor.

Accordingly, the inventors of the present disclosure invented, through several experiments, a display apparatus capable of lowering the reflectance and preventing deterioration of the reflective color without using the highly heat-resistant black matrix.

A purpose according to an embodiment of the present disclosure is to provide a display apparatus capable of lowering the reflectance and improving the reflective color.

Purposes of the present disclosure are not limited to the above-mentioned purpose. Other purposes and advantages of the present disclosure that are not mentioned may be understood based on following descriptions, and may be more clearly understood based on embodiments of the present disclosure. Further, it will be easily understood that the purposes and advantages of the present disclosure may be realized using means shown in the claims and combinations thereof.

A display apparatus according to an embodiment of the present disclosure includes a display panel including a plurality of light-emitting areas and a non-light-emitting area between the plurality of light-emitting areas, and a transmittance control film including a first area having first visible light transmittance, wherein the first area is disposed on the display panel and overlaps at least a portion of the non-light-emitting area, and a plurality of the second areas having second visible light transmittance higher than the first visible light transmittance, wherein the plurality of the second areas overlap the plurality of light-emitting areas.

A display apparatus according to an embodiment of the present disclosure includes a display panel including a plurality of light-emitting areas and a non-light-emitting area between the plurality of light-emitting areas, and a transmittance control film including an opaque area disposed on the display panel and at least overlapping wirings and thin-film transistors disposed in the non-light-emitting area and a plurality of transparent areas overlapping the plurality of light-emitting areas.

Specific details of other embodiments are included in the detailed description and the drawings.

According to an embodiment of the present disclosure, the transmittance control film TCF is disposed on the top surface of the display panel DP such that the first area of the transmittance control film with low visible light transmittance overlaps the entirety of the non-light-emitting area BR where the plurality of gate lines GL, the plurality of data lines DL, and the plurality of thin-film transistors TFT are located, so that reflectance of external light reflected by the plurality of gate lines GL, the plurality of data lines DL, and the electrodes of the plurality of thin-film transistors TFT and visible to the user may be reduced.

Moreover, according to an embodiment of the present disclosure, as the wavelength range and the transmittance value of the transmittance peak of the first area T1 of the transmittance control film TCF are adjusted to be within the predefined ranges, not only the reflectance may be improved, but also the reflective color may be improved.

In addition, according to an embodiment of the present disclosure, as a main absorption peak of a photoacid generator is designed to be lower than a main absorption peak of a photochromic dye by 150 nm or more, the transmittance control film may have a high-resolution coloration pattern.

In addition, according to an embodiment of the present disclosure, as the transmittance control film TCF has a glass transition temperature equal to or higher than 60° C., stability of the coloration pattern in a high-temperature/high-humidity environment may be dramatically improved.

Further, according to an embodiment of the present disclosure, as the anti-oxidation layer is disposed on the transmittance control film, the transmittance control film may be prevented from being discolored by exposure to the external light.

Further, according to an embodiment of the present disclosure, because the transmittance control film is applied to the entirety of the display panel, there is no step between the transparent area and the opaque area, so that the light leakage phenomenon resulted from the step may be fundamentally blocked.

Effects of the present disclosure are not limited to the above-mentioned effects, and other effects as not mentioned will be clearly understood by those skilled in the art from following descriptions.

DETAILED DESCRIPTIONS

Figure 1:
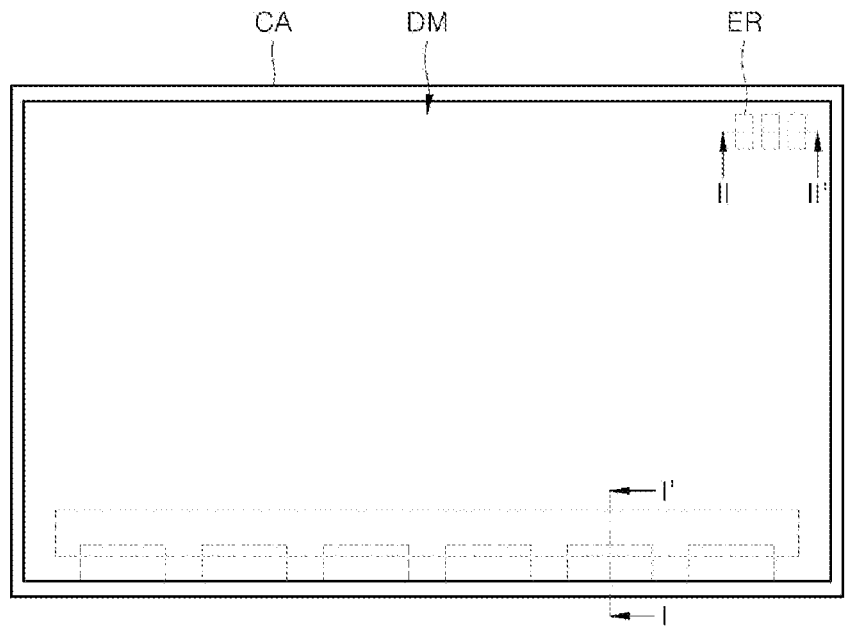
FIG. 1 is a plan view showing a display apparatus according to an embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the present disclosure to those of ordinary skill in the technical field to which the present disclosure belongs.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is no separate explicit description thereof.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, display apparatuses according to embodiments according to the present disclosure will be described in detail with reference to the accompanying drawings.

Figure 2:
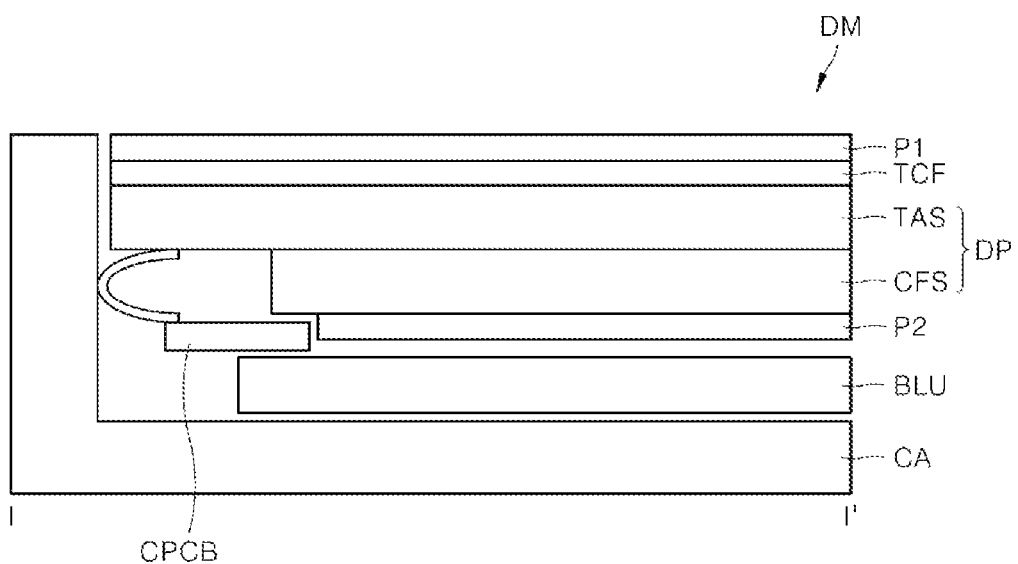
FIGS. 2 and 3 are cross-sectional views showing a display apparatus according to an embodiment of the present disclosure.
Figure 3:
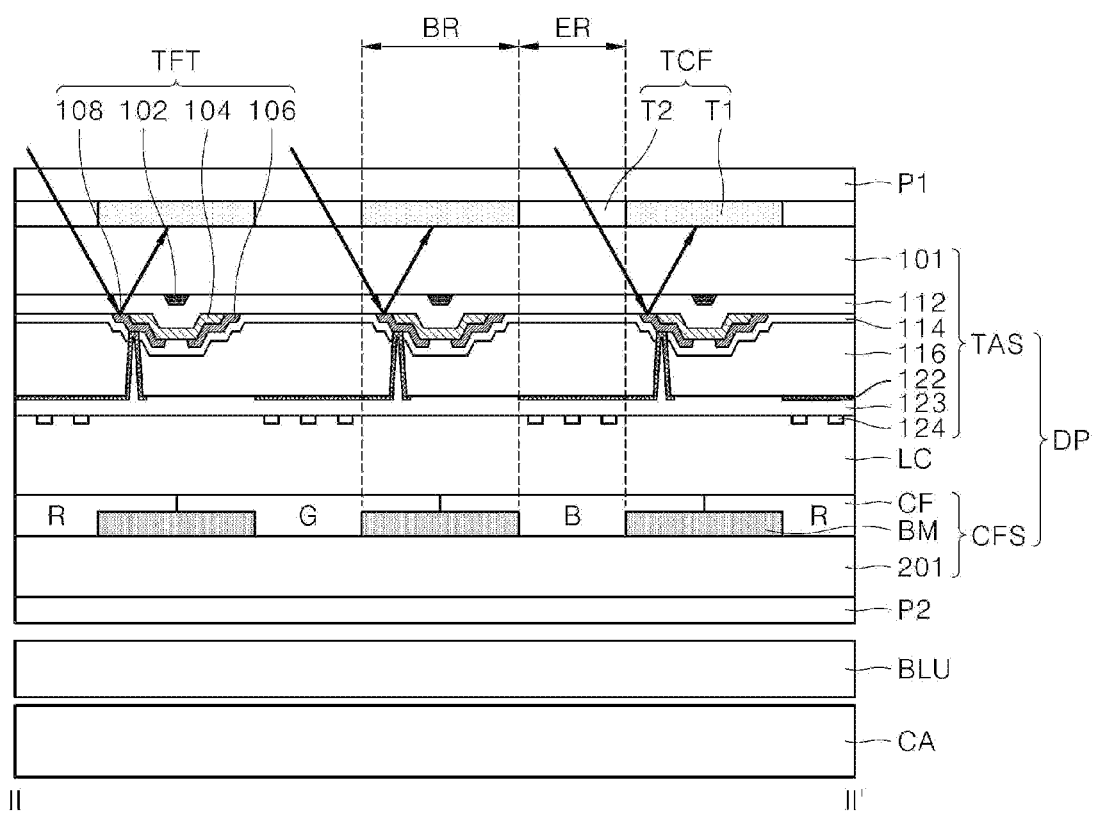
Figure 4:
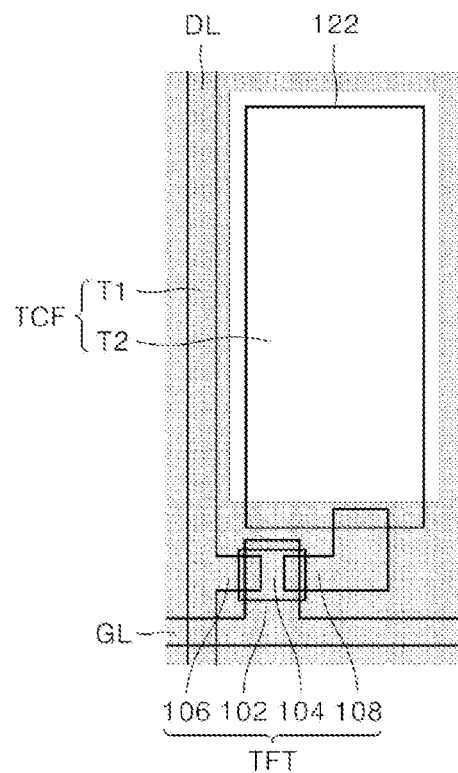
FIG. 4 is a plan view showing one sub-pixel of a display apparatus according to an embodiment of the present disclosure.

FIG. 1 is a plan view showing a display apparatus according to an embodiment of the present disclosure. FIGS. 2 and 3 are cross-sectional views showing a display apparatus according to an embodiment of the present disclosure. FIG. 4 is a plan view showing one sub-pixel of a display apparatus according to an embodiment of the present disclosure.

Referring to FIGS. 1 to 4, a display apparatus according to an embodiment of the present disclosure includes a display module DM and a casing CA for accommodating the same. The display module DM may include a plurality of light-emitting areas ER. An area other than the plurality of light-emitting areas ER may be a non-light-emitting area BR. The plurality of light-emitting areas ER may be included in a plurality of sub-pixel areas, respectively.

The display module DM may, for example, include a display panel DP, a transmittance control film TCF, a first polarizing plate P1, a second polarizing plate P2, and a backlight unit BLU.

The display panel DP includes a color filter substrate CFS and a thin-film transistor array substrate TAS facing each other with a liquid crystal layer LC interposed therebetween.

The thin-film transistor array substrate TAS includes a plurality of gate lines GL, a plurality of data lines DL, a plurality of thin-film transistors TFT, a plurality of pixel electrodes 122, and a common electrode 124 disposed on one surface of the first substrate 101. Each thin-film transistor TFT is disposed in each sub-pixel area and is located in the non-light-emitting area. The plurality of gate lines GL and the plurality of data lines DL are located in the non-light-emitting area.

The thin-film transistor TFT is connected to the gate line GL and the data line DL. The pixel electrode 122 is connected to the thin-film transistor TFT. The thin-film transistor TFT selectively supplies a data signal from the data line DL to the pixel electrode 122 in response to a gate signal from the gate line GL. To this end, the thin-film transistor TFT includes a gate electrode 102 connected to the gate line GL, a source electrode 106 connected to the data line DL, a drain electrode 108 connected to the pixel electrode 122, and a semiconductor layer 104 that defines a channel between the source electrode 106 and the drain electrode 108.

The common electrode 124 has a plurality of slits and is disposed on one surface of the first substrate 101 to form a fringe electric field together with the pixel electrode 122. Alternatively, the common electrode 124 may be disposed on one surface of a second substrate 201 to form a vertical electric field together with the pixel electrode 122.

A gate insulating layer 112 that covers the gate electrode 102 and electrically insulates the semiconductor layer 104 and the gate electrode 102 from each other, a first insulating layer 114 that covers the thin-film transistor TFT, and a planarization layer 116 for planarization of steps resulted from the thin-film transistors TFT are disposed on the first substrate 101. The pixel electrode 122 extends through the planarization layer 116 and the protective insulating layer 114 to be connected to the drain electrode 108 of the thin-film transistor TFT. A second insulating layer 123 is disposed between the pixel electrode 122 and the common electrode 124.

Liquid crystal molecules in the liquid crystal layer LC between the thin-film transistor array substrate TAS and the color filter substrate CFS are rotated by the electric field of the pixel electrode 122 and the common electrode 124. Moreover, as transmittance of light passing through the light-emitting area ER varies based on an amount of rotation of the liquid crystal molecules, gray scale is realized.

The color filter substrate CFS includes a black matrix BM for preventing light leakage and a color filter layer CF for realizing color disposed on one surface of the second substrate 201. The color filter substrate CFS may further include an overcoat layer for planarization and protection of a color filter and a column spacer for maintaining a cell gap. A second polarizing plate P2 may be disposed on the other surface of the second substrate 201.

The black matrix BM is disposed on one surface of the second substrate 201 to overlap the non-light-emitting area BR in which the gate line GL, the data line DL, and the thin-film transistor TFT are disposed. The black matrix 132 serves to distinguish the light-emitting areas ER and prevent optical interference between adjacent light-emitting areas ER.

The color filter layer CF includes red (R), green (G), and blue (B) color filters disposed in the light-emitting areas ER, and the red (R), green (G), and blue (B) color filters are formed on one surface of the second substrate 201 to realize corresponding colors.

The transmittance control film TCF and the first polarizing plate P1 may be disposed on the display panel DP. The transmittance control film TCF may be disposed on the other surface of the first substrate 101 of the thin-film transistor array substrate TAS. The first polarizing plate P1 may be disposed on the transmittance control film TCF.

The transmittance control film TCF may be an adhesive layer and may be directly attached to an entire surface of the display panel DP. The transmittance control film TCF may be adhesive and may be directly attached to the other surface of the first substrate 101 of the thin-film transistor array substrate TAS. The first polarizing plate P1 may be attached to one surface of the display panel DP by the transmittance control film TCF.

The transmittance control film TCF may include a first area T1 that overlaps at least a portion of the non-light-emitting area BR and has first visible light transmittance and a second area T2 that overlaps the plurality of light-emitting areas ER and has second visible light transmittance higher than the first visible light transmittance. In the present embodiment, the first area T1 of the transmittance control film TCF may overlap an entirety of the non-light-emitting area BR including the plurality of thin-film transistors TFT respectively disposed in the sub-pixel areas, and the plurality of gate lines GL and the plurality of data lines DL arranged between the sub-pixel areas. In this regard, the first visible light transmittance and the second visible light transmittance are average transmittances for visible light in a wavelength range from 380 nm to 780 nm. The first visible light transmittance of the first area T1 may be lower than 60% and the second visible light transmittance of the second area T2 may be equal to or higher than 90%. For example, the first visible light transmittance of the first area T1 may be equal to or lower than 50%, equal to or lower than 45%, equal to or lower than 40%, equal to or lower than 35%, equal to or lower than 30%, equal to or lower than 25%, or equal to or lower than 20%. Moreover, the first visible light transmittance of the first area T1 may be equal to or higher than 5%. For example, the first visible light transmittance of the first area T1 may be equal to or higher than 7%, equal to or higher than 9%, equal to or higher than 11%, equal to or higher than 13%, or equal to or higher than 15%. The first area T1 may be an opaque or colored area and the second area T2 may be a transparent or non-colored area.

The transmittance control film TCF may be formed by mixing, for example, a pressure sensitive adhesive with an irreversible photochromic material. The irreversible photochromic material may contain an irreversible photochromic dye that is irreversibly discolored by UV irradiation. The transmittance control film TCF may further contain a photoinitiator or a photoacid generator.

The irreversible photochromic dye is colorless (transparent) before the UV irradiation and is able to become colored (opaque) by irreversible modification of a molecular structure when UV light is irradiated. In the present disclosure, such irreversible photochromic dye is referred to as an photochromic dye of a first type.

The photochromic dye of the first type may include a spirooxazine-based dye, a spiropyran-based dye, a fluorine-based dye, an oxazine-based dye, or a chromene-based dye.

For example, as a blue photochromic dye, a green photochromic dye, and a red photochromic dye of the first type are mixed with each other, the first area T1 of the transmittance control film TCF may be realized to have a black color. Alternatively, the first area T1 of the transmittance control film TCF may be realized to have the black color by being mixed with a black photochromic dye of the first type. For example, the black photochromic dye of the first type of may be 2-anilino-6-dibutylamino-3-methylfluoran.

As the photoacid generator used together with the photochromic dye of the first type, an iodonium compound, a sulfonium compound, a sulfonate compound, and the like may be used. The photoacid generator generates acid during ultraviolet light irradiation to modify a molecular structure of the photochromic dye and maintains the modified molecular structure.

When there is a transmittance slope equal to or greater than 20 μm between the first area T1 and the second area T2 of the transmittance control film TCF, because a spacing between the sub-pixel areas is narrow to be in a range from 10 μm to 20 μm, the first area T1 of the transmittance control film TCF is not able to be disposed to cover the wirings located between the sub-pixel areas. This is because the first area T1 of the transmittance control film TCF expands into the light-emitting areas and the light-emitting areas become narrow.

Therefore, it is important to minimize the transmittance slope between the first area T1 and the second area T2 of the transmittance control film TCF.

The inventors of the present disclosure found that selection of the photoacid generator is an important factor in reducing the transmittance slope between the first area T1 and the second area T2 of the transmittance control film TCF via various experiments.

A main absorption peak of the photoacid generator may be equal to or lower than 400 nm, and for example, the main absorption peak of the photoacid generator may be in a range from 300 nm to 400 nm or from 200 nm to 300 nm. In order to minimize influence on the second area T2, which is the transparent or non-colored area, when forming the first area T1, which is the opaque or colored area, the main absorption peak of the photoacid generator is preferably lower than a main absorption peak of the photochromic dye by 150 nm or more.

Figure 15:
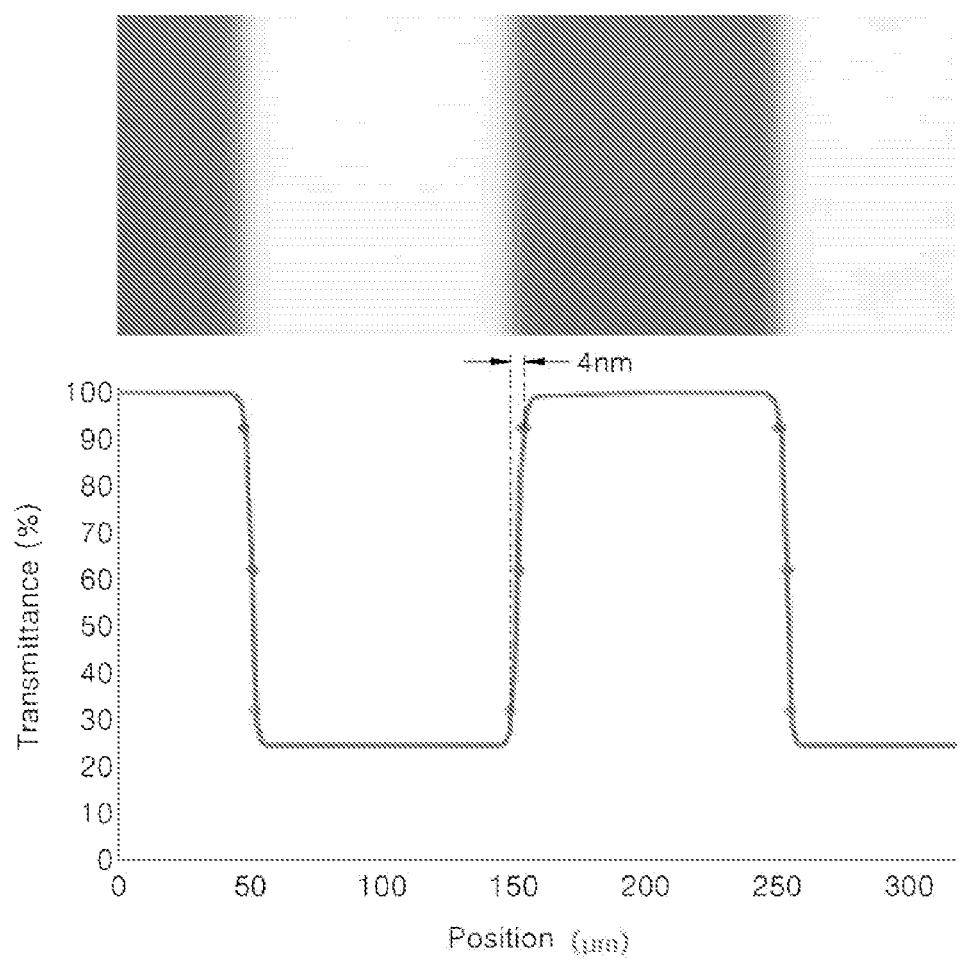
FIG. 15 is a transmittance graph showing a pattern shape of a transmittance control film according to an embodiment of the present disclosure.

As a photoacid generator that meets such conditions is selected, as shown in FIG. 15, the transmittance slope between the first area T1 and the second area T2 of the transmittance control film TCF is reduced to about 4 nm, so that a high-resolution coloration pattern may be formed on the transmittance control film TCF.

In contrast, the irreversible photochromic dye may be colored (opaque) before the UV irradiation and may become colorless (transparent) by the irreversible modification of the molecular structure when the UV light is irradiated. In the present disclosure, such irreversible photochromic dye is referred to as a photochromic dye of a second type.

The photochromic dye of the second type may include an azo-based dye, an anthraquinone-based dye, an indigoid-based dye, a phthalocyanine-based dye, a polymethine-based dye, a triphenylmethane-based dye, a diphenylmethane-based dye, a triphenylamine-based dye, a cyanine-based dye, or an arylcarbonium-based dye.

For example, as azo-based dyes of yellow, magenta, and cyan below are mixed with each other, the first area T1 of the transmittance control film TCF may be realized to have the black color.

1) Yellow: peak wavelength 396 nm

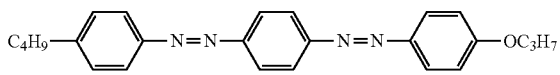

2) Magenta: peak wavelength 522 nm

3) Cyan: peak wavelength 602 nm

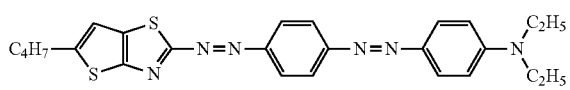

As the photoinitiator used together with the photochromic dye of the second type, a benzophenone-based, acetophenone-based, or thioxantone-based photoinitiator may be used. The main absorption peak of the photoinitiator is preferably equal to or lower than 400 nm, more preferably equal to or lower than 350 nm, in order not to interfere with a light emission wavelength of the display module.

The transmittance control film TCF may be manufactured as an adhesive layer by a separate manufacturing process and then attached to the display panel DP and the polarizing plate P1. Further, the transmittance control film TCF may be formed by coating an adhesive composition on the display panel DP and then curing the composition. When the transmittance control film TCF contains the irreversible photochromic dye of the first type, the first area T1 may be a portion irreversibly discolored resulted from the UV irradiation during the manufacturing process of the adhesive layer, and the second area T2 may be a portion not irradiated with the UV light. In contrast, when the transmittance control film TCF contains the irreversible photochromic dye of the second type, the first area T1 may be the portion not irradiated with the UV light during the manufacturing process of the adhesive layer, and the second area T2 may be the portion irreversibly discolored resulting from the UV irradiation.

The transmittance control film TCF is disposed on the top surface of the display panel DP, specifically, on one surface of the thin-film transistor array substrate 101 such that the first area T1 of the transmittance control film TCF overlaps the entirety of the non-light-emitting area BR where the plurality of gate lines GL, the plurality of data lines DL, and the plurality of thin-film transistors TFT are located, so that reflectance of external light reflected by the plurality of gate lines GL, the plurality of data lines DL, and the electrodes of the plurality of thin-film transistors TFT and visible to the user may be reduced.

Moreover, a transmittance spectrum of the first area T1 of the transmittance control film TCF may be adjusted to have a transmittance peak in a predefined range by adjusting a type of irreversible photochromic material and UV irradiation energy to adjust the reflective color of the display panel DP. When, for example, copper (Cu) is used for the wirings of the thin-film transistor array substrate TAS and the electrodes of the thin-film transistor TFT, the reflective color becomes reddish. In this case, the first area T1 of the transmittance control film TCF may have, for example, the transmittance peak in a wavelength range from 510 nm to 520 nm, and a transmittance value of the transmittance peak may be in a range from 15% to 30%.

Not only the reflectance may be improved, but also the reflective color may be improved by adjusting the wavelength range and the transmittance value of the transmittance peak of the first area T1 of the transmittance control film TCF to be within the above-described ranges.

Figure 13:
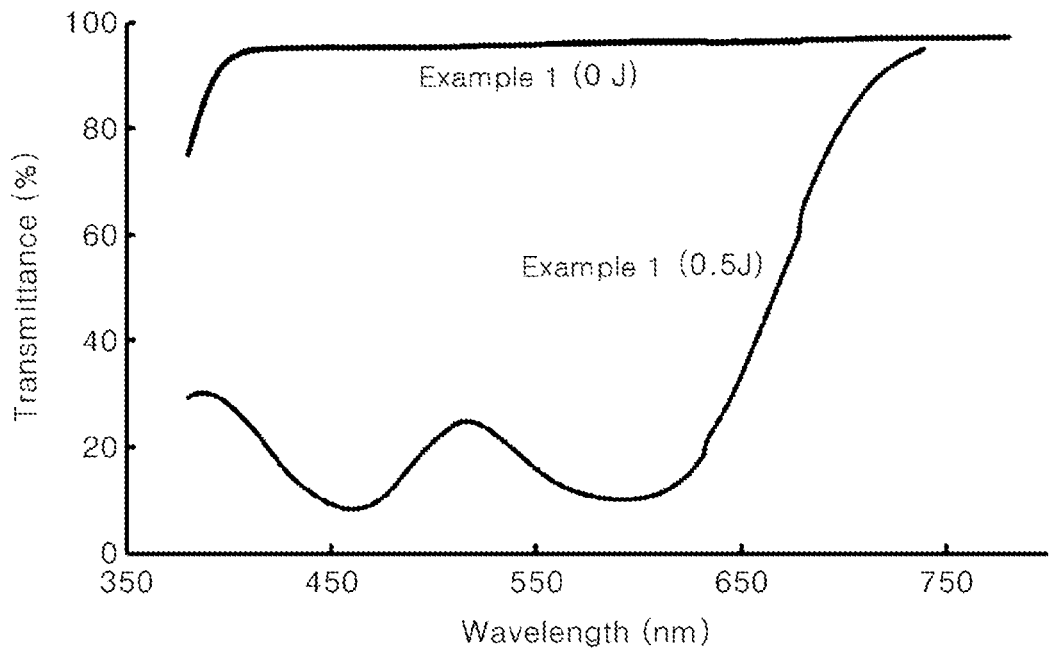
FIGS. 13 and 14 show transmittance spectra of a first area of a transmittance control film according to embodiments of the present disclosure.
Figure 14:
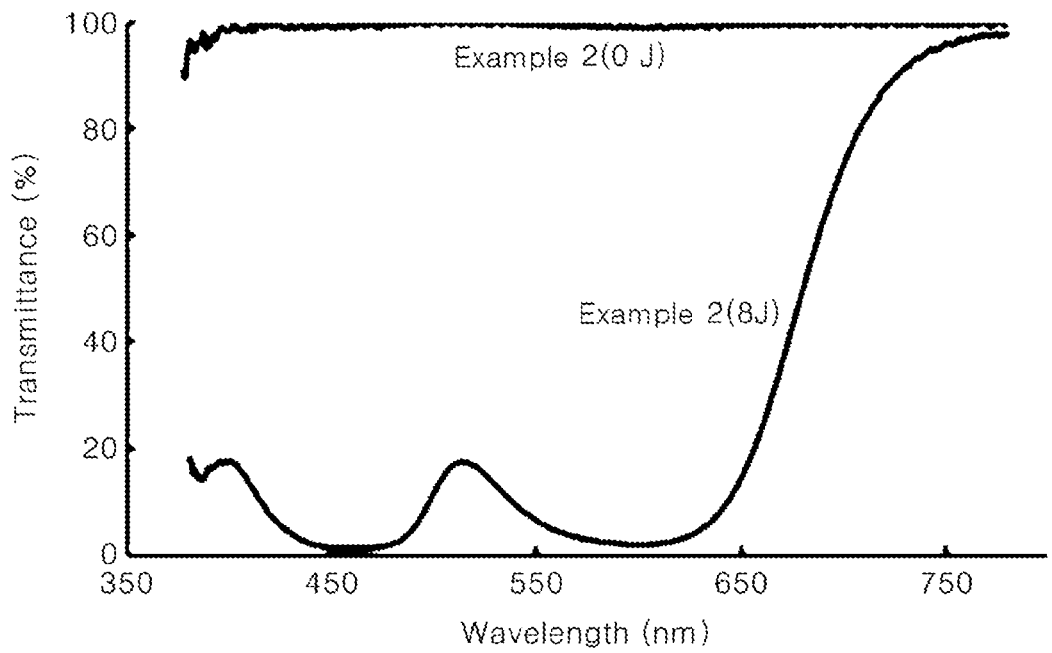

FIGS. 13 and 14 show transmittance spectra of a first area of a transmittance control film according to embodiments of the present disclosure. Referring to FIG. 13, in a case of Example 1, when irradiated with the UV light of 365 nm wavelength 0.5 J/cm$^2$, the first area of the transmittance control film has the transmittance peak at a wavelength of 517 nm and the transmittance value of the transmittance peak is 24.6%. Referring to FIG. 14, in a case of Example 2, when irradiated with the UV light of 365 nm wavelength 8 J/cm$^2$, the first area of the transmittance control film has the transmittance peak at a wavelength of 514 nm and the transmittance value of the transmittance peak is 17.5%. Graphs represented as 0 J in FIGS. 13 and 14 are transmission spectra of the first area before the UV irradiation.

As may be seen in Table 1 below, when compared with Comparative Example to which the transmittance control film is not applied, in the case of Examples 1 and 2, the reflectance decreased to about 5% and the reflective color moved closer to a neutral region. In this regard, Comparative Example is a display apparatus of a flip panel structure including a display panel in which copper (Cu) is used for wirings of a thin-film transistor array substrate and electrodes of a thin-film transistor.

TABLE 1

|  | Comparative Example (not applied) | Example 1 | Example 2 |
|---|---|---|---|
| Reflectance | 8.61% | 5.1% | 4.96% |
| Reflective color a*/b* | 1.47/5.39 | −0.1/2.0 | −0.5/1.5 |

The display module DM may further include a control printed circuit board CPCB connected to the thin-film transistor array substrate TAS via a flexible film. The flexible film may have a source driver integrated circuit mounted thereon. A plurality of circuits realized with driver chips may be mounted on the control printed circuit board CPCB, and, for example, a timing controller and a power controller may be mounted on the control printed circuit board CPCB. The control printed circuit board CPCB may be disposed close to the rear surface of the display panel DP and to the color filter substrate CFS to reduce the bezel.

Figure 5:
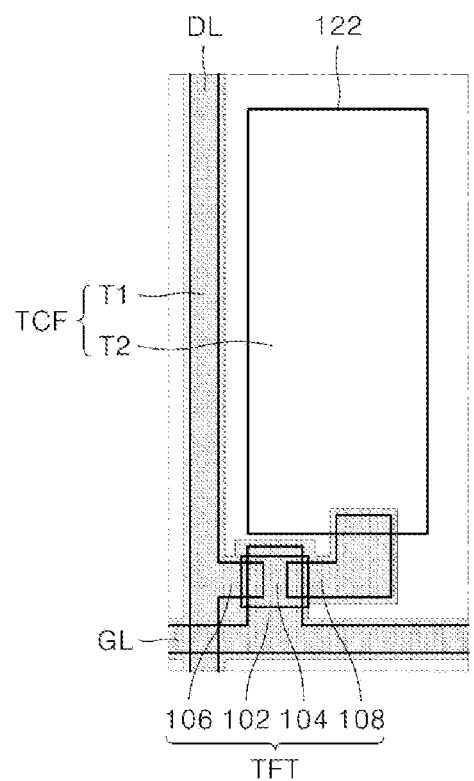
FIG. 5 is a plan view showing one sub-pixel of a display apparatus according to another embodiment of the present disclosure.

FIG. 5 is a plan view showing one sub-pixel of a display apparatus according to another embodiment of the present disclosure.

Referring to FIG. 5, unlike FIG. 4, the first area T1 of the transmittance control film TCF may be disposed to overlap the plurality of gate lines GL, the plurality of data lines DL, and the plurality of thin-film transistors TFT located in the non-light-emitting area BR. The first area T1 of the transmittance control film TCF may have a shape corresponding to shapes of the plurality of gate lines GL, the plurality of data lines DL, and the plurality of thin-film transistors TFT, and may have a greater width than the plurality of gate lines GL, the plurality of data lines DL, and the plurality of thin-film transistors TFT. The first visible light transmittance of the first area T1 of the transmittance control film TCF may be lower than 60% and the second visible light transmittance of the second area T2 may be equal to or higher than 90%. The first area T1 of the transmittance control film TCF may have, for example, the transmittance peak in the wavelength range from 510 nm to 520 nm, and the transmittance value of the transmittance peak may be in the range from 15% to 30%.

Even in the present embodiment, because the first area T1 of the transmittance control film TCF completely covers the plurality of gate lines GL, the plurality of data lines DL, and the plurality of thin-film transistors TFT, the reflectance of the external light reflected by the plurality of gate lines GL, the plurality of data lines DL, and the electrodes of the plurality of thin-film transistors TFT and visible to the user may be reduced and the reflective color may be improved.

FIGS. 6 to 9 are cross-sectional views showing a display apparatus according to embodiments of the present disclosure.

Figure 6:
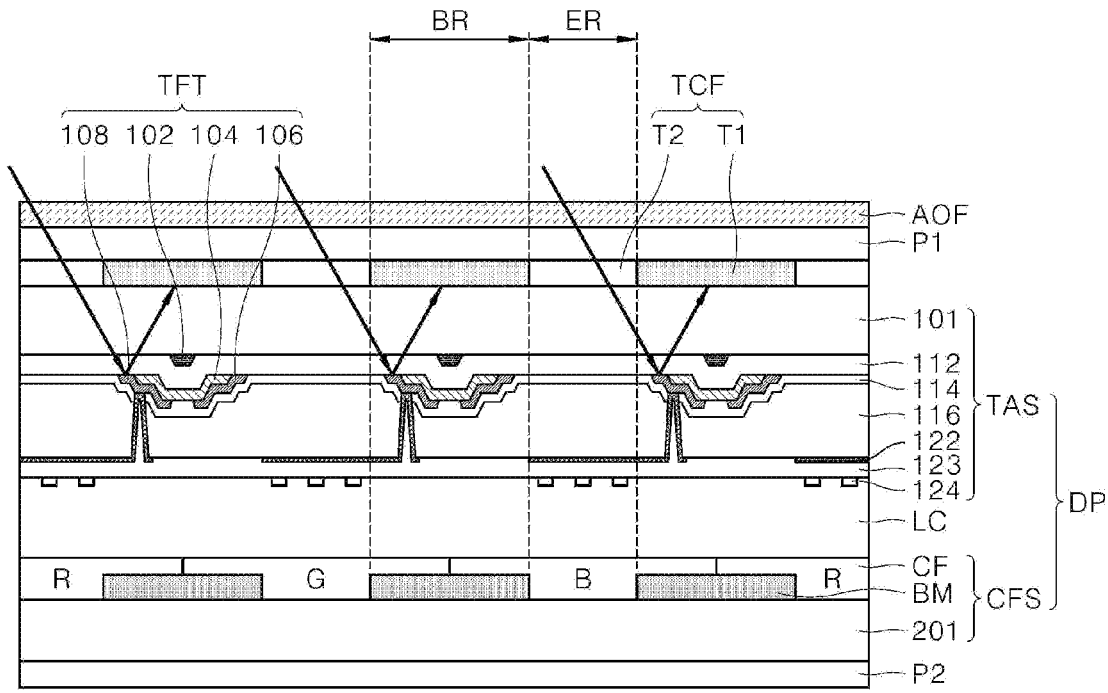
FIGS. 6 to 9 are cross-sectional views showing a display apparatus according to embodiments of the present disclosure.

The display apparatus according to one embodiment of the present disclosure shown in FIG. 6 may further include an anti-oxidation layer AOF disposed on the transmittance control film TCF when compared with the display apparatus according to one embodiment of the present disclosure shown in FIG. 3. The anti-oxidation layer AOF may block wavelengths equal to or lower than 400 nm, preferably wavelengths equal to or lower than 380 nm. The anti-oxidation layer AOF may prevent the transmittance control film TCF from being deteriorated by the UV light contained in the external light when being exposed to the external light (e.g., sunlight), that is, transmittance changes of the first area T1 or the second area T2 of the transmittance control film TCF, and may prevent moisture or the like from an external environment from penetrating into the transmittance control film TCF. The anti-oxidation layer AOF may be made of a polymer material containing a UV absorbent. The UV absorbent may include at least one of benzotriazole-based, benzophenone-based, salicylic acid-based, salicylate-based, cyanoacrylate-based, cinnamate-based, oxalic acid anilide-based, oxanilide-based, polystyrene-based, azomethine-based, and triazine-based absorbents, but the present disclosure may not be limited thereto. The polymer material may be triacetyl cellulose (TAC), polyethylene terephthalate (PET), or the like, but may not be limited thereto. The anti-oxidation layer AOF may further contain a light stabilizer. As the light stabilizer, a hindered amine light stabilizer may be used, and a chain reaction may be stopped by absorbing alkyl radicals and peroxide radicals generated by exposure to the ultraviolet light. The light stabilizer may contain a 2,2,6,6-tetramethylpiperidine derivative.

Although it is shown in FIG. 6 that the anti-oxidation layer AOF is disposed on the first polarizing plate P1, the anti-oxidation layer AOF may be disposed between the first polarizing plate P1 and the transmittance control film TCF.

In one embodiment, instead of separately forming the anti-oxidation layer AOF, an ultraviolet absorber, the light stabilizer, or a combination thereof may be added to the transmittance control film TCF.

Figure 7:
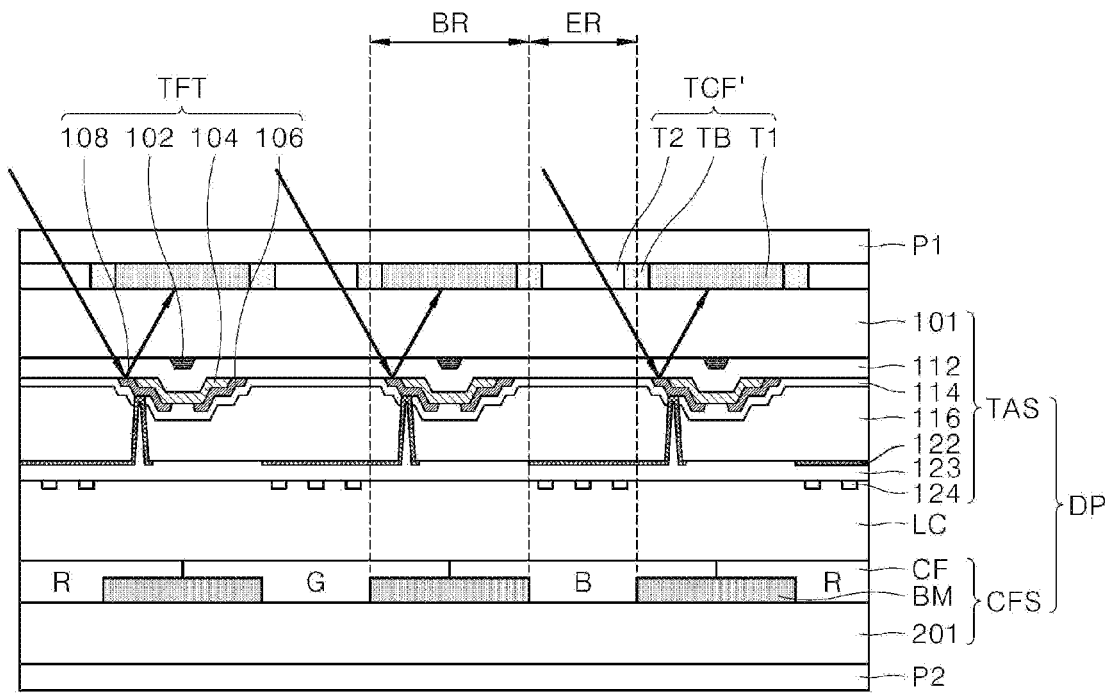

The display apparatus according to one embodiment of the present disclosure shown in FIG. 7 may include a transmittance control film TCF further including a boundary area TB located between the first area T1 and the second area T2 when compared with the display apparatus according to one embodiment of the present disclosure shown in FIG. 3. The boundary area TB may be an area in which the visible light transmittance gradually increases from the first area T1 to the second area T2. As the transmittance control film TCF' further includes the boundary area TB, external light reflectance may be reduced for a wider field of view (FOV).

The transmittance control film TCF may be manufactured as an adhesive layer by a separate manufacturing process and then attached to the display panel DP and the polarizing plate P1. Further, the transmittance control film TCF may be formed by coating the adhesive composition on the display panel DP and then curing the composition.

The above-described adhesive layer-type transmittance control film TCF has an advantage of being able to be directly disposed on the other surface of the first substrate 101 without a separate adhesive because of adhesiveness thereof.

Figure 16:
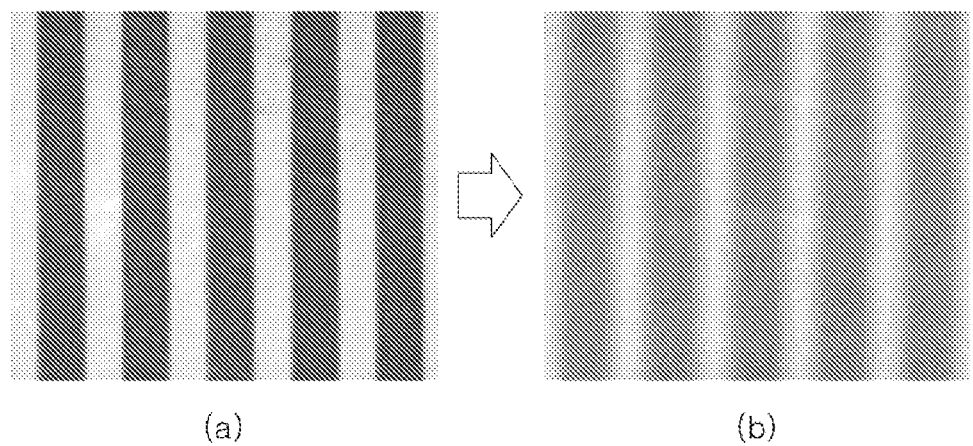
FIGS. 16 and 17 are results of evaluating coloration pattern stability of a transmittance control film according to an embodiment of the present disclosure.

However, FIG. 16 is a result of evaluating coloration pattern stability of the transmittance control film TCF before improvement. Part (a) in FIG. 16 is an initial state of the transmittance control film TCF, and part (b) in FIG. 16 is a state after 10 hours at a room temperature. Referring to FIG. 16, it may be seen that a size of the coloration pattern increases and the coloration pattern fades after 10 hours at the room temperature.

The inventors of the present disclosure confirmed via various experiments that the coloration pattern stability at the room temperature is not good when a storage modulus of the transmittance control film TCF is too low, for example, equal to or lower than 0.1 MPa. Therefore, the storage modulus of the transmittance control film TCF was increased to secure the coloration pattern stability at the room temperature without losing the adhesiveness. When the storage modulus of the transmittance control film TCF is in a range from 0.2 MPa to 20 Mpa, the coloration pattern stability at the room temperature may be secured without losing the adhesiveness. In the present disclosure, the storage modulus is a value measured at 25° C. The coloration pattern stability means a degree at which the position or the size of the coloration pattern, that is, the first area T1 in the transmittance control film TCF is maintained in an initial state.

Figure 17:
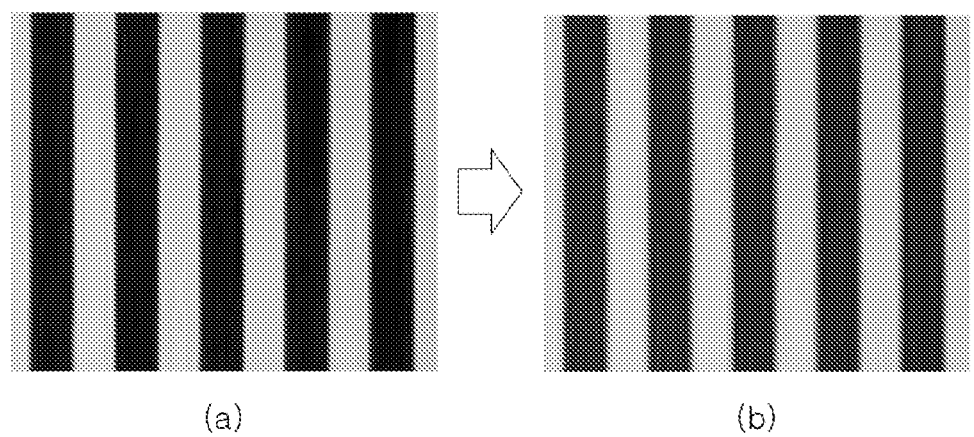

FIG. 17 is a result of evaluating coloration pattern stability of the transmittance control film TCF after the improvement. Part (a) in FIG. 17 is an initial state of the transmittance control film TCF, and part (b) in FIG. 17 is a state after 10 hours at the room temperature. It may be seen that the coloration pattern of the transmittance control film TCF having the storage modulus equal to or higher than 0.2 MPa is maintained even after 10 hours at the room temperature.

Figure 18:
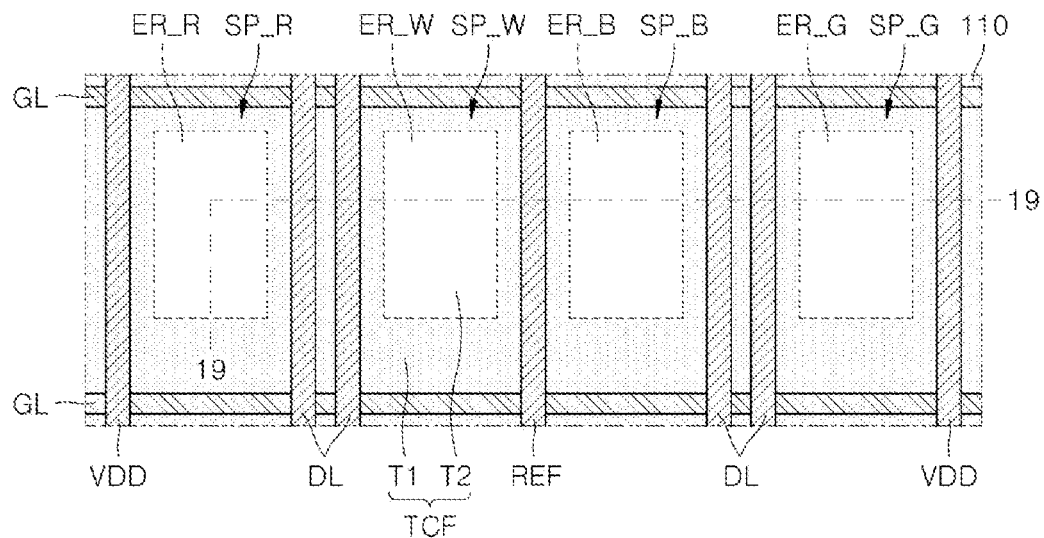
FIG. 18 is a plan view illustrating a display module of a display apparatus according to another embodiment of the present disclosure.
Figure 19:
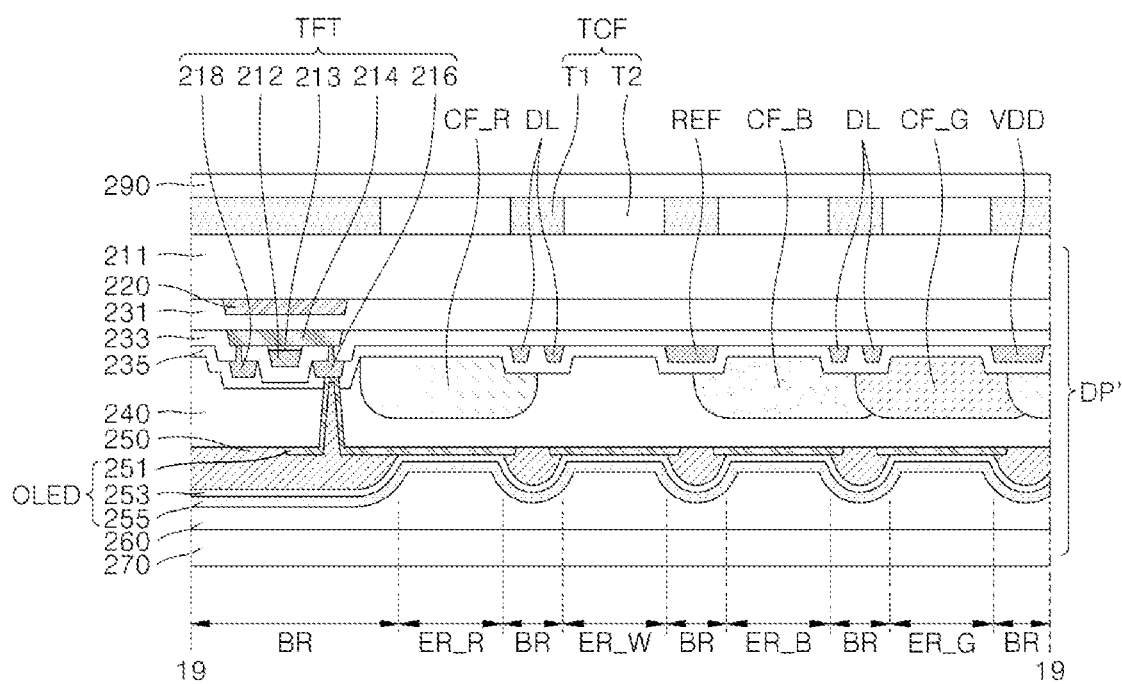
FIG. 19 is a cross-sectional view illustrating a display module of a display apparatus according to another embodiment of the present disclosure.

FIG. 18 is a plan view illustrating a display module of a display apparatus according to an embodiment of the present disclosure. FIG. 19 is a cross-sectional view illustrating a display module of a display apparatus according to an embodiment of the present disclosure. FIGS. 18 and 19 illustrate one pixel area of a display module according to an embodiment of the present disclosure.

Referring to FIGS. 18 and 19, the display module of the present embodiment may include a display panel DP', the transmittance control film TCF, and a polarizing layer 290.

The display panel DP' is a bottom emission-type organic light emitting display panel, and includes the plurality of thin-film transistors TFT disposed on one surface of a substrate 211, a plurality of organic light-emitting diodes OLED respectively connected to the plurality of thin-film transistors TFT, and color filters CF_R, CF_B, and CF_G disposed between the plurality of thin-film transistors TFT and the plurality of organic light-emitting diodes OLED. The adhesive layer-type transmittance control film TCF may be attached to the display panel DV, and a polarizing layer 290 may be disposed on the transmittance control film TCF. An antireflection film may be disposed instead of the polarizing layer 290.

A light blocking layer 220, a buffer layer 231, the thin-film transistor TFT, an interlayer insulating film 233, a passivation layer 235, a planarization layer 240, a bank 250, the color filters CF_R, CF_B, and CF_G, a first electrode 251, an organic light-emitting layer 253, a second electrode 255, an adhesive layer 260, and a protective substrate 270 disposed on one surface of the substrate 211 may be included. The adhesive layer-type transmittance control film TCF may be attached on the other surface of the substrate 211 of the display panel DV.

The buffer layer 231 covers the light blocking layer 220 on one surface of the substrate 211, and the gate lines GL, and the thin-film transistors TFT, and the interlayer insulating film 233 are disposed on the buffer layer 231. On the interlayer insulating film 233, the data lines DL, a reference line REF, and driving voltage lines VDD disposed in the non-light-emitting area BR between sub-pixel areas SP_R, SP_W, SP_B, and SP_G are located.

Each thin-film transistor TFT is disposed in each sub-pixel area and may include a semiconductor layer 214, a gate electrode 212, a drain electrode 218, and a source electrode 216. The semiconductor layer 214 may be disposed on the buffer layer 213 so as to overlap the light blocking layer 220. The semiconductor layer 214 and the gate electrode 212 are insulated from each other by a gate insulating layer 213, and the gate electrode 212 may overlap the semiconductor layer 214. The source electrode 216 and the drain electrode 218 may pass through the interlayer insulating film 233 and contact the semiconductor layer 214.

The color filters CF_R, CF_B, and CF_G may be disposed on the passivation layer 235 for covering the thin-film transistors TFT, the interlayer insulating film 233, the data lines DL, the reference line REF, and the driving voltage lines VDD. The red color filter CF_R is positioned in a red light-emitting area ER_R, a blue color filter CF_B is positioned in a blue light-emitting area ER_B, and a green color filter CF_G is positioned in a green light-emitting area ER_G. No color filter is located in a white light-emitting area EA_W. In the white light-emitting area EA_W, white light emitted from an organic light-emitting layer 175 is emitted to the outside through the substrate 211 as it is. On the passivation layer 235, the planarization layer 240 for planarizing steps caused by the thin-film transistors TFT and the color filters CF_R, CF_B, and CF_G is positioned.

The first electrodes 251 electrically connected to the respective source electrodes 216 of the thin-film transistors TFT via the planarization layer 240 and the passivation layer 235 are disposed on the planarization layer 240. In addition, a bank 250 for covering edges of the first electrodes 251 is disposed on the planarization layer 240 so as to define the light-emitting areas ER_R, ER_W, ER_B, and ER_G. The organic light-emitting layer 253 and the second electrode 255 are sequentially disposed on the bank 250 and the first electrode 251. In this regard, the first electrode 251, the organic light-emitting layer 253, and the second electrode 255 constitute an organic light-emitting diode OLED. The organic light-emitting layer 253 may emit white light. In addition, the adhesive layer 260 and the protective substrate 270 for covering the organic light-emitting diode OLED may be disposed.

The storage modulus of the adhesive layer-type transmittance control film TCF attached to an entirety of one surface of the display panel DP' is preferably in a range from 0.2 MPa to 20 MPa. The polarizing layer 290 may be attached to the transmittance control film TCF.

The first area T1 of the transmittance control film TCF may overlap an entirety of the non-light-emitting area BR. The first area T1 of the transmittance control film TCF may overlap the bank 250. Because the first area T1 of the transmittance control film TCF completely covers the plurality of gate lines GL, the plurality of data lines DL, and the plurality of thin-film transistors TFT in the non-light-emitting area BR, external light reflectance by the plurality of gate lines GL, the plurality of data lines DL, and the electrodes of the plurality of thin-film transistors TFT may be reduced, and the reflective color may be improved.

In addition, because the transmittance control film TCF has the storage modulus in the range from 0.2 MPa to 20 MPa, the coloration pattern stability at the room temperature may be improved. That is, because the transmittance control film TCF has the storage modulus in the range from 0.2 MPa to 20 MPa, the position or the size of the first area T1 of the transmittance control film TCF may be maintained in the initial state at the room temperature.

The structure of the bottom emission-type organic light-emitting display panel shown in FIGS. 18 and 19 is exemplary, and the adhesive layer-type transmittance control film TCF is able to be applied to the bottom emission-type organic light-emitting display panels with various structures. In one example, the adhesive layer-type transmittance control film TCF may also be applied to top emission-type organic light-emitting display panels with various structures.

In addition, an adhesive layer-type or film-type transmittance control film TCF may be applied to an inorganic light-emitting display panel including an inorganic light-emitting diode.

When the storage modulus of the transmittance control film TCF is increased, the coloration pattern stability at the room temperature may be secured without losing the adhesiveness. When the storage modulus of the transmittance control films TCF and TCF' is in the range from 0.2 MPa to 20 MPa, the coloration pattern stability at the room temperature may be secured without losing the adhesiveness.

However, there is a problem in that the coloration pattern stability is not secured in a high-temperature/high-humidity environment only by increasing the storage modulus of the adhesive layer-type transmittance control film TCF in the range from 0.2 MPa to 20 MPa.

Figures 20, 21:
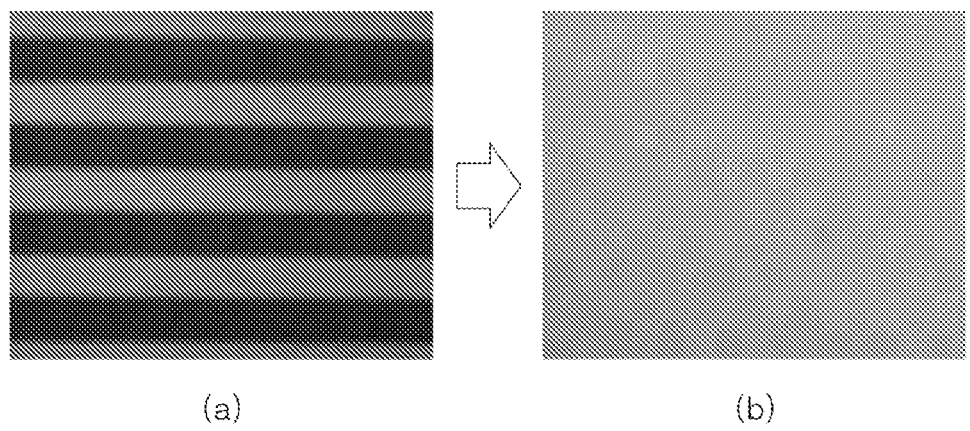
FIG. 20 shows a result of evaluating reliability at a high-temperature of a transmittance control film according to an embodiment of the present disclosure.
FIG. 21 shows a result of evaluating reliability at a high-temperature/high-humidity of transmittance control films of various film types.

FIG. 20 shows a result of evaluating reliability at a high-temperature of a transmittance control film according to an embodiment of the present disclosure. Specifically, FIG. 20 is a result of performing high-temperature reliability evaluation (80° C. and 500 Hr) after forming a linear coloration pattern on the adhesive layer-type transmittance control film TCF described above. Part (a) in FIG. 20 shows the transmittance control film TCF before the high-temperature reliability evaluation, and part (b) in FIG. 20 shows the transmittance control film TCF after the high-temperature reliability evaluation.

Referring to FIG. 20, it may be seen that, in the adhesive layer-type transmittance control film TCF, the coloration pattern disappears as the high-temperature reliability evaluation is performed. Tg of the adhesive layer-type transmittance control film TCF is lower than the room temperature, for example, is about −20° C. Diffusion of the photochromic dye occurs in a high-temperature environment, causing the problem of disappearing the coloration pattern.

Therefore, in order to secure the coloration pattern stability in the high-temperature/high-humidity environment, it is necessary to fundamentally block the diffusion of the photochromic dye within the transmittance control film TCF.

The inventors of the present disclosure found that the diffusion of the photochromic dye may be reduced or suppressed by manufacturing the transmittance control film TCF to be in a non-adhesive, cured film type through various experiments.

FIG. 21 shows a result of evaluating reliability at a high-temperature/high-humidity of transmittance control films of various film types. For comparison, the high-temperature reliability evaluation of the adhesive layer-type transmittance control film is also shown. A size of initial coloration patterns formed on all types of transmittance control films was equally 110 um.

Referring to FIG. 21, it may be seen that the coloration pattern stability is dramatically improved even in the high-temperature/high-humidity environment when the Tg is increased to be equal to or higher than 60° C. by increasing the degree of curing. The higher the degree of curing, that is, the higher the Tg, the more improved the coloration pattern stability in the high-temperature/high-humidity environment.

Figure 8:
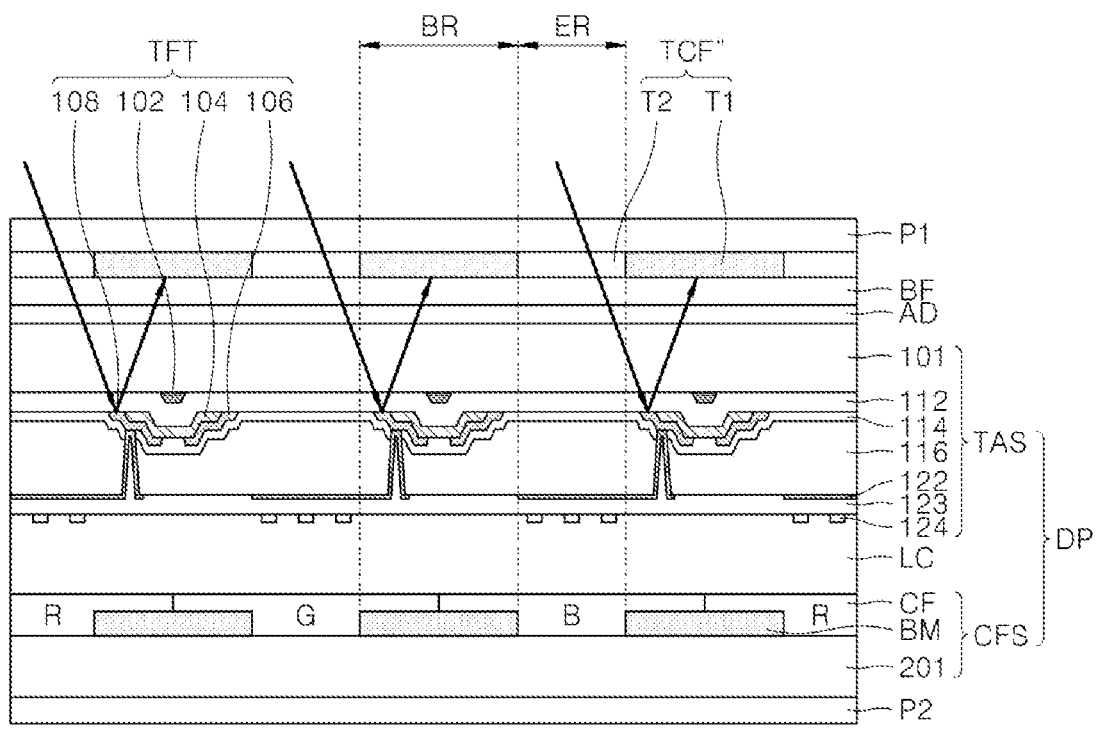

The display apparatus according to one embodiment of the present disclosure shown in FIG. 8 may further include a base film BF coated with the transmittance control film TCF" and adhesive layers AD when compared with the display apparatus according to one embodiment of the present disclosure shown in FIG. 3.

The transmittance control film TCF may be a film having no adhesion and may be in a cured state after being applied on one surface of the base film BF. The transmittance control film TCF" may be a polymer film having a glass transition temperature (Tg) equal to or higher than 60° C., preferably equal to or higher than 80° C. The transmittance control film TCF" may be a polymer film having a glass transition temperature equal to or lower than 200° C. A weight average molecular weight (Mw) of the film-type transmittance control film TCF" is preferably equal to or greater than 2,000,000 and equal to or smaller than 5,000,000. The weight average molecular weight is measured by gel permeation chromatography (GPC) and calculated in terms of polystyrene. A storage modulus of the film-type transmittance control film TCF" is preferably equal to or higher than 20 MPa and equal to or lower than 500 GPa. The other surface of the base film BF may be attached to an entire surface of the display panel DP by the adhesive layer AD. Moreover, one surface, that is, the top surface, of the transmittance control film TCF may be attached to the first polarizing plate P1 by the adhesive layer AD. The adhesive layer AD may contain an optically clear adhesive (OCA) or a pressure sensitive adhesive (PSA) but the present disclosure may not be limited thereto.

In one embodiment, the base film BF may be omitted, and the film-type transmittance control film TCF" may be attached to an entirety of one face of the display panel DP by the adhesive layer AD.

Because the first area T1 of the transmittance control film TCF" completely covers the plurality of gate lines GL, the plurality of data lines DL, and the plurality of thin-film transistors TFT in the non-light-emitting area BR, the external light reflectance by the plurality of gate lines GL, the plurality of data lines DL, and the electrodes of the plurality of thin-film transistors TFT may be reduced, and the reflective color may be improved.

In addition, because the transmittance control film TCF' is the polymer film having the glass transition temperature equal to or higher than 60° C., the coloration pattern stability may be dramatically improved even in the high-temperature/high-humidity environment. That is, because the transmittance control film TCF" is the polymer film having the glass transition temperature equal to or higher than 60° C., even in the high-temperature/high-humidity environment, a position or a size of the first area T1 of the transmittance control film TCF" may be maintained in an initial state.

Figure 9:
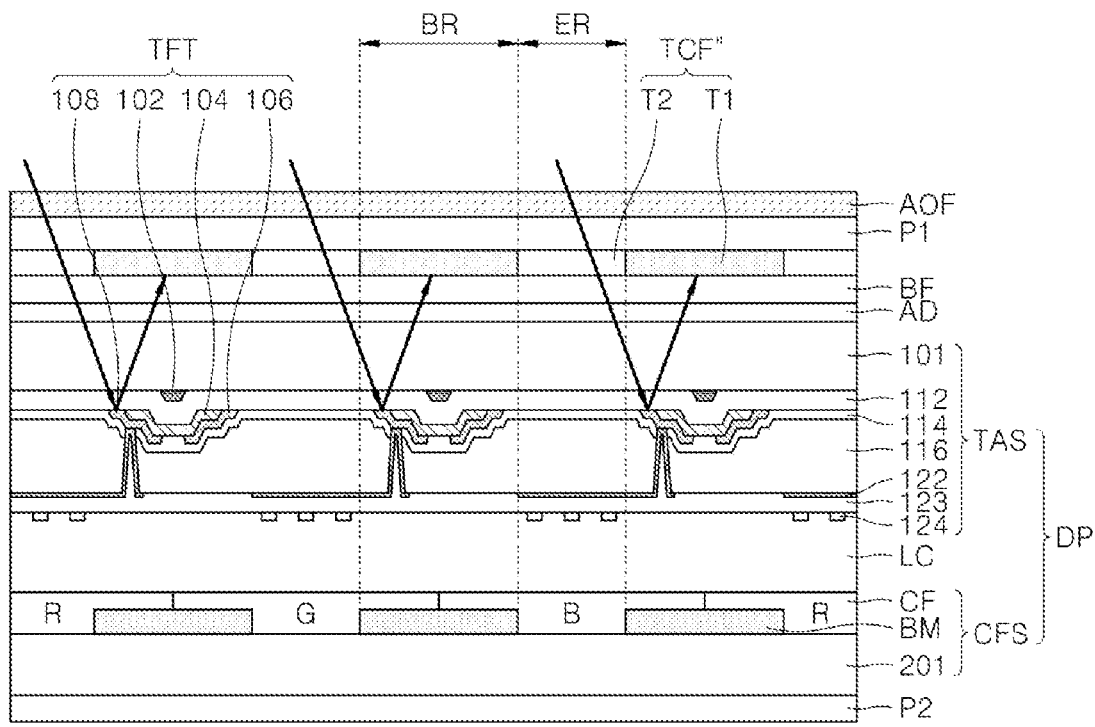

The display apparatus according to one embodiment of the present disclosure shown in FIG. 9 may further include the anti-oxidation layer AOF disposed on the transmittance control film TCF" when compared with the display apparatus according to one embodiment of the present disclosure shown in FIG. 8. The anti-oxidation layer AOF may block the wavelengths equal to or lower than 380 nm. The anti-oxidation layer AOF may prevent the transmittance control film TCF" from being discolored and deteriorated by the UV light contained in the external light when being exposed to the external light (e.g., the sunlight), and may prevent the moisture or the like from an external environment from penetrating into the transmittance control film TCF".

FIG. 9 shows that the anti-oxidation layer AOF is disposed on the first polarizing plate P1, but the anti-oxidation layer AOF may be disposed between the first polarizing plate P1 and the transmittance control film TCF' in other embodiments.

Figure 22:
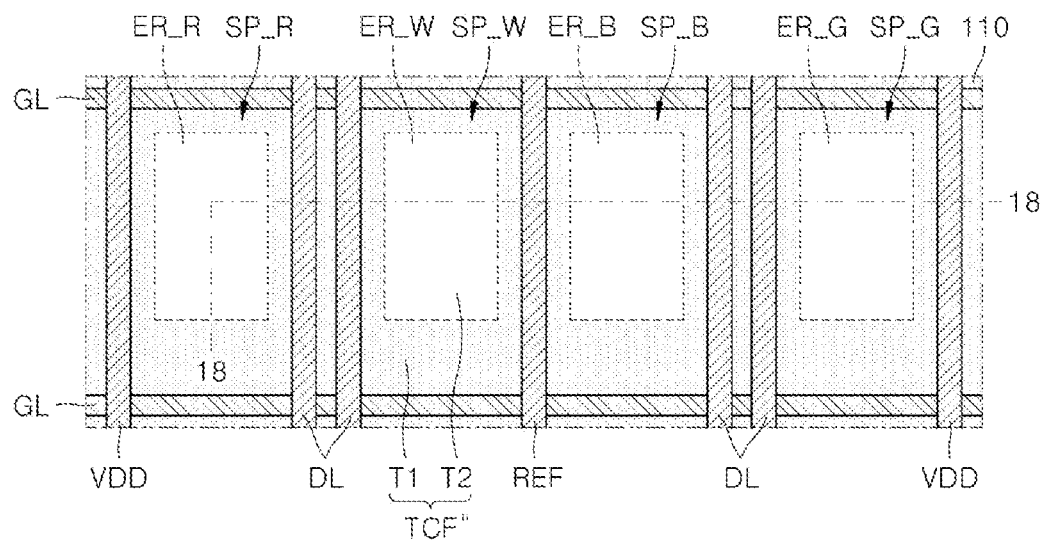
FIG. 22 is a plan view illustrating a display module of a display apparatus according to another embodiment of the present disclosure.
Figure 23:
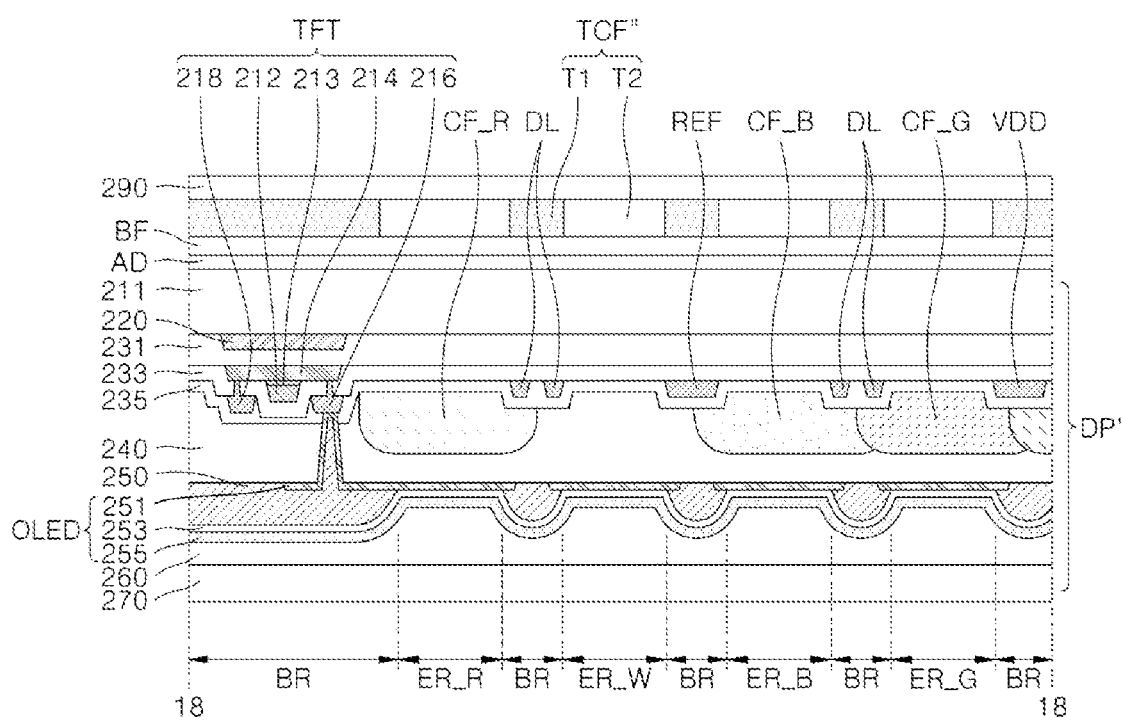
FIG. 23 is a cross-sectional view illustrating a display module of a display apparatus according to another embodiment of the present disclosure.

FIG. 22 is a plan view illustrating a display module of a display apparatus according to an embodiment of the present disclosure. FIG. 23 is a cross-sectional view illustrating a display module of a display apparatus according to an embodiment of the present disclosure. FIGS. 22 and 23 illustrate one pixel area of a display module according to an embodiment of the present disclosure.

Referring to FIGS. 22 and 23, the display module of the present embodiment may include the display panel DP', the transmittance control film TCF, the base film BF, and the adhesive layer AD.

The display panel DP' is the bottom emission-type organic light emitting display panel, and includes the plurality of thin-film transistors TFT disposed on one surface of the substrate 211, the plurality of organic light-emitting diodes OLED respectively connected to the plurality of thin-film transistors TFT, and the color filters CF_R, CF_B, and CF_G disposed between the plurality of thin-film transistors TFT and the plurality of organic light-emitting diodes OLED. The base film BF coated with the transmittance control film TCF" may be attached to the display panel DP' by the adhesive layer AD, and the polarizing layer 290 may be disposed on the transmittance control film TCF'. The antireflection film may be disposed instead of the polarizing layer 290.

The light blocking layer 220, the buffer layer 231, the thin-film transistor TFT, the interlayer insulating film 233, the passivation layer 235, the planarization layer 240, the bank 250, the color filters CF_R, CF_B, and CF_G, the first electrode 251, the organic light-emitting layer 253, the second electrode 255, the adhesive layer 260, and the protective substrate 270 disposed on one surface of the substrate 211 may be included. In addition, the adhesive layer AD, the base film BF, the transmittance control film TCF'', and the polarizing layer 290 may be disposed on the display panel DP'. Specifically, the adhesive layer AD, the base film BF, the transmittance control film TCF', and the polarizing layer 290 may be disposed on the other surface of the substrate 211 of the display panel DP'.

The buffer layer 231 covers the light blocking layer 220 on one surface of the substrate 211, and the gate lines GL, and the thin-film transistors TFT, and the interlayer insulating film 233 are disposed on the buffer layer 231. On the interlayer insulating film 233, the data lines DL, the reference line REF, and the driving voltage lines VDD disposed in the non-light-emitting area BR between the sub-pixel areas SP_R, SP_W, SP_B, and SP_G are located.

Each thin-film transistor TFT is disposed in each sub-pixel area and may include the semiconductor layer 214, the gate electrode 212, the drain electrode 218, and the source electrode 216. The semiconductor layer 214 may be disposed on the buffer layer 213 so as to overlap the light blocking layer 220. The semiconductor layer 214 and the gate electrode 212 are insulated from each other by the gate insulating layer 213, and the gate electrode 212 may overlap the semiconductor layer 214. The source electrode 216 and the drain electrode 218 may pass through the interlayer insulating film 233 and contact the semiconductor layer 214.

The color filters CF_R, CF_B, and CF_G may be disposed on the passivation layer 235 for covering the thin-film transistors TFT, the interlayer insulating film 233, the data lines DL, the reference line REF, and the driving voltage lines VDD. The red color filter CF_R is positioned in the red light-emitting area ER_R, the blue color filter CF_B is positioned in the blue light-emitting area ER_B, and the green color filter CF_G is positioned in the green light-emitting area ER_G. No color filter is located in the white light-emitting area EA_W. In the white light-emitting area EA_W, the white light emitted from the organic light-emitting layer 175 is emitted to the outside through the substrate 211 as it is. On the passivation layer 235, the planarization layer 240 for planarizing steps caused by the thin-film transistors TFT and the color filters CF_R, CF_B, and CF_G is positioned.

The first electrodes 251 electrically connected to the respective source electrodes 216 of the thin-film transistors TFT via the planarization layer 240 and the passivation layer 235 are disposed on the planarization layer 240. In addition, the bank 250 for covering the edges of the first electrodes 251 is disposed on the planarization layer 240 so as to define the light-emitting areas ER_R, ER_W, ER_B, and ER_G. The organic light-emitting layer 253 and the second electrode 255 are sequentially disposed on the bank 250 and the first electrode 251. In this regard, the first electrode 251, the organic light-emitting layer 253, and the second electrode 255 constitute the organic light-emitting diode OLED. The organic light-emitting layer 253 may emit the white light. In addition, the adhesive layer 260 and the protective substrate 270 for covering the organic light-emitting diode OLED may be disposed.

The transmittance control film TCF'' may be the film having no adhesion and may be in the cured state after being applied on one surface of the base film BF. The transmittance control film TCF'' may be the polymer film having the glass transition temperature (Tg) equal to or higher than 60° C., preferably equal to or higher than 80° C. The weight average molecular weight of the film-type transmittance control film TCF' is preferably equal to or greater than 2,000,000 and equal to or smaller than 5,000,000. The storage modulus of the film-type transmittance control film TCF' is preferably equal to or higher than 20 MPa and equal to or lower than 500 GPa. The other surface of the base film BF may be attached to the entirety of one surface of the display panel DP by the adhesive layer AD. The adhesive layer AD may contain the optically clear adhesive (OCA) or the pressure sensitive adhesive (PSA) but the present disclosure may not be limited thereto. In one embodiment, the base film BF may be omitted, and the film-type transmittance control film TCF' may be attached to the entirety of one face of the display panel DP' by the adhesive layer AD.

The first area T1 of the transmittance control film TCF'' may overlap the entirety of the non-light-emitting area BR. The first area T1 of the transmittance control film TCF'' may overlap the bank 250. Because the first area T1 of the transmittance control film TCF'' completely covers the plurality of gate lines GL, the plurality of data lines DL, and the plurality of thin-film transistors TFT in the non-light-emitting area BR, the external light reflectance by the plurality of gate lines GL, the plurality of data lines DL, and the electrodes of the plurality of thin-film transistors TFT may be reduced, and the reflective color may be improved.

In addition, because the transmittance control film TCF' is the polymer film having the glass transition temperature equal to or higher than 60° C., the coloration pattern stability may be dramatically improved even in the high-temperature/high-humidity environment. That is, because the transmittance control film TCF'' is the polymer film having the glass transition temperature equal to or higher than 60° C., even in the high-temperature/high-humidity environment, the position or the size of the first area T1 of the transmittance control film TCF'' may be maintained in the initial state.

The structure of the bottom emission-type organic light-emitting display panel shown in FIGS. 22 and 23 is exemplary, and the transmittance control film TCF'' is able to be applied to the bottom emission-type organic light-emitting display panels with various structures. In one example, the transmittance control film TCF'' may also be applied to the top emission-type organic light-emitting display panels with various structures.

In addition, the transmittance control film TCF'' may be applied to the inorganic light-emitting display panel including the inorganic light-emitting diode.

Figure 10:
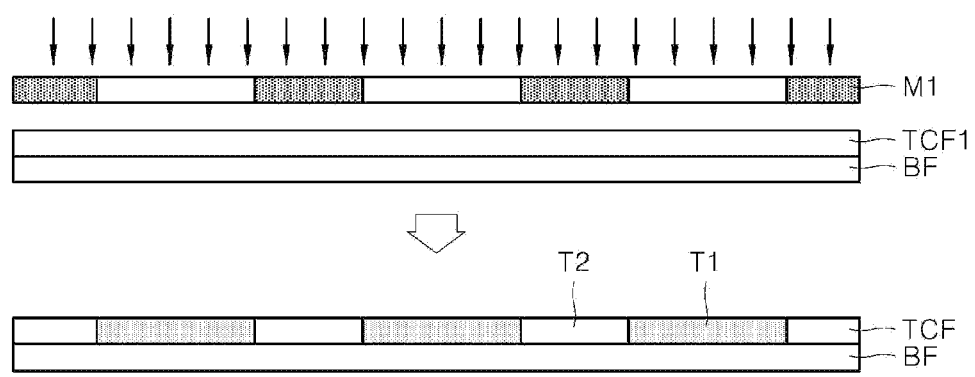
FIGS. 10 to 12 are diagrams illustrating a method for manufacturing a transmittance control film according to embodiments of the present disclosure.
Figure 11:
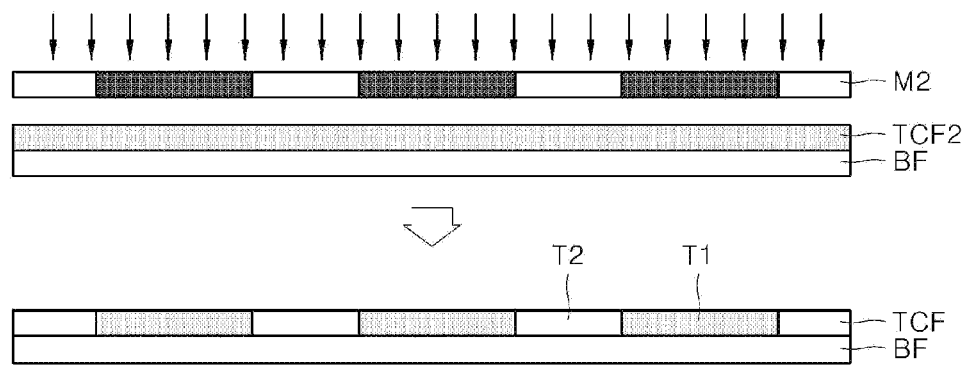
Figure 12:
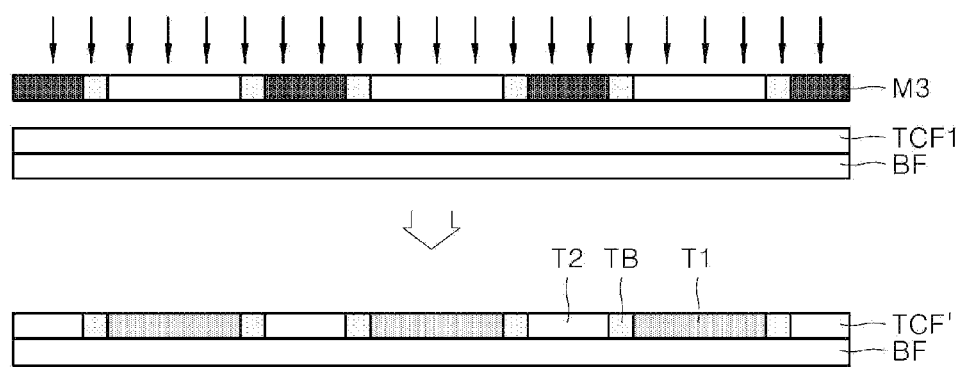

FIGS. 10 to 12 are diagrams illustrating a method for manufacturing a transmittance control film according to embodiments of the present disclosure.

Referring to FIG. 10, for example, the base film BF is coated with an adhesive composition TCF1 containing the irreversible photochromic dye of the first type. Then, the adhesive composition TCF1 may be cured. Then, UV light is irradiated to the adhesive composition TCF1 using a mask M1 including a light blocking portion patterned so as not to cover areas corresponding to the first area T1 of the transmittance control film TCF, in other words, to cover the second area T2. Accordingly, the transmittance control film TCF having the first area T1 and the second area T2 may be formed. When a degree of curing of the adhesive composition TCF1 is low, the adhesive layer-type transmittance control film TCF may be formed. In this regard, when the degree of curing of the adhesive composition TCF1 is further increased, the film-type transmittance control film TCF" may be formed.

Referring to FIG. 11, for example, the base film BF is coated with an adhesive composition TCF2 containing the irreversible photochromic dye of the second type. Then, the adhesive composition TCF2 may be cured. Then, UV light is irradiated to the adhesive composition TCF2 using a mask M2 including a light blocking portion patterned so as not to cover areas corresponding to the second area T2 of the transmittance control film TCF, in other words, to cover the first area T1. Accordingly, the transmittance control film TCF having the first area T1 and the second area T2 may be formed. When a degree of curing is low, the adhesive layer-type transmittance control film TCF may be formed. In this regard, when the degree of curing is further increased, the film-type transmittance control film TCF" may be formed.

Referring to FIG. 12, for example, the base film BF is coated with the adhesive composition TCF1 containing the irreversible photochromic dye of the first type. Then, the adhesive composition TCF1 may be cured. Then, the UV light is irradiated to the adhesive composition TCF1 using a halftone mask M3 including a light blocking portion patterned so as not to cover areas corresponding to the first area T1 of the transmittance control film TCF, in other words, to cover the second area T2 and including a semi-transmissive portion corresponding to the boundary area between the first area T1 and the second area T2. The semi-transmissive portion may be a portion in which the UV transmittance decreases toward the light blocking portion. Accordingly, the transmittance control film TCF having the first area T1, the boundary area TB, and the second area T2 may be formed. The transmittance control film TCF may also be formed in the adhesive layer type or the film type depending on the degree of curing.

The display apparatus according to an embodiment of the present disclosure may be described as follows.

According to embodiments of the present disclosure includes a display apparatus including a display panel including a plurality of light-emitting areas and a non-light-emitting area between the plurality of light-emitting areas, and a transmittance control film disposed on the display panel and including a first area having first visible light transmittance, wherein the first area overlaps at least a portion of the non-light-emitting area, and a plurality of the second areas having second visible light transmittance higher than the first visible light transmittance, wherein the plurality of the second areas overlap the plurality of light-emitting areas.

According to some embodiments of the present disclosure, the first visible light transmittance may be lower than 60% and the second visible light transmittance may be equal to or higher than 90%.

According to some embodiments of the present disclosure, the first area may have the transmittance peak in a wavelength range from 510 nm to 520 nm to have a transmittance peak in a predefined range, and a transmittance value of the transmittance peak may be in a range from 15% to 30%.

According to some embodiments of the present disclosure, the display panel may include wirings and thin-film transistors disposed on one surface of a first substrate and disposed in the non-light-emitting area. The transmittance control film may be disposed on the other surface of the first substrate, and the first area of the transmittance control film may overlap the wirings and the thin-film transistors.

According to some embodiments of the present disclosure, the display panel may include a color filter substrate including a plurality of color filters and a black matrix between the plurality of color filters disposed on one surface of a second substrate, and the first area of the transmittance control film may overlap the black matrix.

According to some embodiments of the present disclosure, the transmittance control film may further include a boundary area between the first area and the second area, and the boundary area may be an area where visible light transmittance gradually increases from the first area to the second area.

According to some embodiments of the present disclosure, the transmittance control film may contain an photochromic dye irreversibly discolored by UV irradiation and a photoacid generator.

According to some embodiments of the present disclosure, a main absorption peak of the photoacid generator may be equal to or lower than 400 nm, and may be lower than a main absorption peak of the photochromic dye by 150 nm or more.

According to some embodiments of the present disclosure, the transmittance control film may be adhesive and may be directly attached to an entire surface of the display panel.

According to some embodiments of the present disclosure, the display apparatus may further include a base film disposed on the display panel, the transmittance control film may be disposed on one surface of the base film, and the other surface of the base film may be attached to an entire surface of the display panel by an adhesive layer.

According to some embodiments of the present disclosure, the display apparatus may further include an anti-oxidation layer disposed on the transmittance control film, and the anti-oxidation layer may block wavelengths equal to or lower than 380 nm.

According to embodiments of the present disclosure, a display apparatus including a display panel includes a plurality of light-emitting areas and a non-light-emitting area between the plurality of light-emitting areas, and a transmittance control film disposed on the display panel and including an opaque area overlapping at least wirings and thin-film transistors disposed in the non-light-emitting area and a plurality of transparent areas overlapping the plurality of light-emitting areas.

According to some embodiments of the present disclosure, visible light transmittance of the opaque area may be lower than 60% and visible light transmittance of the transparent areas may be equal to or higher than 90%.

According to some embodiments of the present disclosure, the opaque area may have a transmittance peak in a wavelength range from 510 nm to 520 nm to adjust a reflective color of the display panel and a transmittance value of the transmittance peak may be in a range from 15% to 30%.

According to some embodiments of the present disclosure, the display panel may include a color filter substrate including a plurality of color filters and a black matrix between the plurality of color filters disposed on one surface of a second substrate, and the opaque area of the transmittance control film may overlap the black matrix.

According to some embodiments of the present disclosure, the transmittance control film may contain an photochromic dye irreversibly discolored by UV irradiation and a photoacid generator.

According to some embodiments of the present disclosure, the transmittance control film may have adhesion and may be directly attached to an entire surface of the display panel.

According to some embodiments of the present disclosure, a main absorption peak of the photoacid generator may be equal to or lower than 400 nm, and may be lower than a main absorption peak of the photochromic dye by 150 nm or more.

According to some embodiments of the present disclosure, the display apparatus may further include a base film disposed on the display panel, and the transmittance control film may be disposed on one surface of the base film, and the other surface of the base film may be attached to an entire surface of the display panel by an adhesive layer.

According to some embodiments of the present disclosure, the transmittance control film may be a polymer film having no adhesiveness and having a glass transition temperature equal to or higher than 60° C.

According to some embodiments of the present disclosure, the display apparatus may further include an anti-oxidation layer disposed on the transmittance control film, and the anti-oxidation layer may block wavelengths equal to or lower than 380 nm.

A scope of protection of the present disclosure should be construed by the scope of the claims, and all technical ideas within the scope equivalent thereto should be construed as being included in the scope of the present disclosure. Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A display apparatus comprising:
a display panel including a plurality of light-emitting areas and a non-light-emitting area between the plurality of light-emitting areas; and
a transmittance control film disposed on the display panel and including a first area having first visible light transmittance, wherein the first area overlaps at least a portion of the non-light-emitting area, and a plurality of second areas having second visible light transmittance higher than the first visible light transmittance, wherein the plurality of the second areas overlap the plurality of light-emitting areas,
wherein the transmittance control film contains a photochromic dye irreversibly discolored by UV irradiation and a photoacid generator, and
wherein a main absorption peak of the photoacid generator is equal to or lower than 400 nm, and is lower than a main absorption peak of the photochromic dye by 150 nm or more.

2. The display apparatus of claim 1, wherein the first visible light transmittance is lower than 60% and the second visible light transmittance is equal to or higher than 90%.

3. The display apparatus of claim 1, wherein the first area has a transmittance peak in a wavelength range from 510 nm to 520 nm to adjust a reflective color of the display panel and a transmittance value of the transmittance peak is in a range from 15% to 30%.

4. The display apparatus of claim 1, wherein the display panel includes wirings and thin-film transistors disposed on one surface of a first substrate and disposed in the non-light-emitting area,
wherein the transmittance control film is disposed on the other surface of the first substrate, and the first area of the transmittance control film overlaps the wirings and the thin-film transistors.

5. The display apparatus of claim 1, wherein the transmittance control film further includes a boundary area between the first area and the second area,
wherein the boundary area is an area where visible light transmittance gradually increases from the first area to the second area.

6. The display apparatus of claim 1, wherein the transmittance control film is adhesive and is directly attached to an entire surface of the display panel.

7. The display apparatus of claim 1, further comprising a base film disposed on the display panel,
wherein the transmittance control film is disposed on one surface of the base film, and the other surface of the base film is attached to an entire surface of the display panel by an adhesive layer.

8. The display apparatus of claim 7, wherein the transmittance control film is a polymer film having no adhesiveness and having a glass transition temperature equal to or higher than 60° C.

9. The display apparatus of claim 1, further comprising an anti-oxidation layer disposed on the transmittance control film,
wherein the anti-oxidation layer blocks wavelengths equal to or lower than 380 nm.

10. A display apparatus comprising:
a display panel including a plurality of light-emitting areas and a non-light-emitting area between the plurality of light-emitting areas; and
a transmittance control film disposed on the display panel and including an opaque area and at least overlapping wirings and thin-film transistors disposed in the non-light-emitting area and a plurality of transparent areas overlapping the plurality of light-emitting areas,
wherein the transmittance control film contains a photochromic dye irreversibly discolored by UV irradiation and a photoacid generator, and
wherein a main absorption peak of the photoacid generator is equal to or lower than 400 nm, and is lower than a main absorption peak of the photochromic dye by 150 nm or more.

11. The display apparatus of claim 10, wherein visible light transmittance of the opaque area is lower than 60% and visible light transmittance of the transparent areas is equal to or higher than 90%.

12. The display apparatus of claim 10, wherein the opaque area has a transmittance peak in a wavelength range from 510 nm to 520 to adjust a reflective color of the display panel and a transmittance value of the transmittance peak is in a range from 15% to 30%.

13. The display apparatus of claim 10, wherein the transmittance control film is adhesive and is directly attached to an entire surface of the display panel.

14. The display apparatus of claim 10, further comprising a base film disposed on the display panel,
   wherein the transmittance control film is disposed on one surface of the base film, and the other surface of the base film is attached to an entire surface of the display panel by an adhesive layer.

15. The display apparatus of claim 14, wherein the transmittance control film is a polymer film having no adhesiveness and having a glass transition temperature equal to or higher than 60° C.

16. The display apparatus of claim 10, further comprising an anti-oxidation layer disposed on the transmittance control film,
   wherein the anti-oxidation layer blocks wavelengths equal to or lower than 380 nm.

* * * * *